(12) United States Patent
Hu et al.

(10) Patent No.: US 8,338,217 B2
(45) Date of Patent: Dec. 25, 2012

(54) METHOD OF FABRICATING A SOLAR CELL

(75) Inventors: Yen-Cheng Hu, New Taipei (TW);
Cheng-Chang Kuo, Taichung (TW);
Jun-Wei Chen, Kaohsiung (TW);
Hsin-Feng Li, Tainan (TW); Jen-Chieh Chen, Miaoli County (TW);
Zhen-Cheng Wu, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/049,886

(22) Filed: Mar. 16, 2011

(65) Prior Publication Data

US 2012/0171805 A1 Jul. 5, 2012

(30) Foreign Application Priority Data

Dec. 29, 2010 (TW) .............................. 99146614 A

(51) Int. Cl.
*H01L 31/18* (2006.01)
(52) U.S. Cl. .................... 438/72; 257/E31.001
(58) Field of Classification Search .................... 438/72; 257/E31.001
See application file for complete search history.

(56) References Cited

U.S. PATENT DOCUMENTS

| | | | | |
|---|---|---|---|---|
| 6,629,367 B2 * | 10/2003 | Burdon et al. | .................. | 29/852 |
| 7,816,167 B2 * | 10/2010 | Yu et al. | .......................... | 438/57 |
| 2007/0295399 A1 | 12/2007 | Carlson | | |
| 2008/0241986 A1* | 10/2008 | Rohatgi et al. | .................. | 438/72 |

FOREIGN PATENT DOCUMENTS

| | | |
|---|---|---|
| CN | 101728454 | 6/2010 |
| CN | 101764170 | 6/2010 |
| TW | 0480737 | 3/2002 |
| TW | 200531297 | 9/2005 |
| TW | I262603 | 9/2006 |
| TW | 200919740 | 5/2009 |
| TW | 200943556 | 10/2009 |
| TW | I296858 | 3/2011 |

OTHER PUBLICATIONS

"First Office Action of China Counterpart Application", issued on Jun. 7, 2012, p. 1-p. 4.

* cited by examiner

*Primary Examiner* — Calvin Lee
*Assistant Examiner* — Monica D Harrison
(74) *Attorney, Agent, or Firm* — Jianq Chyun IP Office

(57) ABSTRACT

A method of fabricating a solar cell is provided. A first type semiconductor substrate having a first surface and a second surface is provided. A second type doped diffusion region is formed in parts of the first type semiconductor substrate. The second type doped diffusion region extends within the first type semiconductor substrate from the first surface. An anti-reflection coating (ARC) in contact with second type doped diffusion region is formed over the first surface. A conductive paste including conductive particles and dopant is formed over the ARC. A co-firing process for enabling the conductive paste to penetrate the ARC to form a first contact conductor embedded in the ARC is performed. During the co-firing process, the dopant diffuses into the second type doped diffusion region and a second type heavily doped diffusion region is formed. A second contact conductor is formed on the second surface.

22 Claims, 4 Drawing Sheets

METHOD OF FABRICATING A SOLAR CELL

CROSS-REFERENCE TO RELATED APPLICATION

This application claims the priority benefit of Taiwan application serial no. 99146614, filed on Dec. 29, 2010. The entirety of the above-mentioned patent application is hereby incorporated by reference herein and made a part of this specification.

BACKGROUND OF THE INVENTION

1. Field of the Invention

The present invention relates to a method of fabricating a solar cell, and more particularly, to a method of fabricating a solar cell with low costs and favorable process controllability.

2. Description of Related Art

Solar energy is a kind of clean, non-pollutant and inexhaustible energy resource. Since the pollution and supply shortage problem resulted from petrochemical energy resource, solar energy frequently draws attention. Because solar energy can be converted into electric power by solar cells directly, research and development of solar cells become an important issue.

Silicon-based solar cell is a well-known solar cell. In the silicon-based solar cell, a P-N junction is generated between different types of semiconductor layers (i.e. P-type semiconductor layer and N-type semiconductor layer). When the P-N junction is irradiated by sunlight, electron-hole pairs are generated because electrons in the semiconductors are excited from a valence band into a conductive band by transferring the energy of photons. Electrons and holes are affected by an electric field such that holes move along the direction of the electric field and electrons move along a direction opposite to the direction of the electric field. When the solar cells are electrically coupled to a load via connection wires, a loop is formed and a current generated from the solar cells flows through the load.

In the solar cells, an N+ doping region is required to be formed between a contact conductor and a N-type semiconductor layer such that an ohmic contact between the contact conductor and the N-type semiconductor layer is formed. In the prior arts, the N+ doping region is fabricated by photolithography process, laser patterning process or etch-back process. Obviously, fabrication of the N+ doping region requires additional process, and fabrication costs of solar cells increases due to the fabrication of the N+ doping region. Moreover, the photolithography process, laser patterning process or etch-back process for fabricating the N+ doping region is difficult to control. During the photolithography process, laser patterning process or etch-back process, defects in the semiconductor layer often generate and yield-rate of the solar cells decreases accordingly. How to increase yield-rate of the solar cells without significantly increasing fabrication costs is a problem to be solved.

SUMMARY OF THE INVENTION

The present invention provides a method of fabricating a solar cell. The method makes the fabrication of the solar cell simple and effectively reduces fabrication costs.

The present invention provides a method of fabricating a solar cell. A first type semiconductor substrate is provided. The first type semiconductor substrate has a first surface and a second surface opposite to the first surface. A second type doped diffusion region is formed in a portion of the first type semiconductor substrate. The second type doped diffusion region extends in the first type semiconductor substrate from the first surface. An anti-reflection layer is formed on the first surface of the first type semiconductor substrate. The anti-reflection layer is in contact with the second type doped diffusion region. A conductive paste is formed on the anti-reflection layer. The conductive paste includes conductive particles, dopant, matrix and binder. A co-firing process is performed for enabling the conductive paste to penetrate the anti-reflection layer to form a first contact conductor embedded in the anti-reflection layer, and to form a second type heavily doped diffusion region by diffusing the dopant into the second type doped diffusion region during the co-firing process. A second contact conductor is formed on the second surface of the first type semiconductor substrate.

The present invention provides another method of fabricating a solar cell. A first type semiconductor substrate is provided. The first type semiconductor substrate has a first surface and a second surface opposite to the first surface. A second type doped diffusion region is formed in a portion of the first type semiconductor substrate. The second type doped diffusion region extends in the first type semiconductor substrate from the first surface. An anti-reflection layer is formed on the first surface of the first type semiconductor substrate. The anti-reflection layer is in contact with the second type doped diffusion region. A conductive paste is formed on the anti-reflection layer. The conductive paste includes conductive particles and dopant. A co-firing process is performed for enabling the conductive pastes to penetrate the anti-reflection layer to form a first contact conductor embedded in the anti-reflection layer, and to form a second type heavily doped diffusion region by diffusing the dopant into the second type doped diffusion region during the co-firing process.

In an embodiment of the invention, the first type semiconductor substrate is a P-type semiconductor substrate, and the second type doped diffusion region is an N-type doped diffusion region, for example.

In an embodiment of the invention, a thickness of the first type semiconductor substrate is greater than a depth of the second type doped diffusion region.

In an embodiment of the invention, the conductive particles include silver (Ag) particles or aluminum (Al) particles.

In an embodiment of the invention, the dopant includes $H_3PO_4$ or $P_2O_5$.

In an embodiment of the invention, the dopant includes $B_2O_3$ or aluminum salts.

In an embodiment of the invention, the matrix includes silicon oxide matrix or silicon matrix.

In an embodiment of the invention, the binder includes a thickening agent or a wetting agent.

In an embodiment of the invention, the conductive paste further includes an additive.

In an embodiment of the invention, the conductive paste further includes a solvent.

In an embodiment of the invention, the conductive paste is formed on the anti-reflection layer by a screen printing process.

In an embodiment of the invention, the anti-reflection layer is formed on the first surface of the first type semiconductor substrate by a chemical vapor deposition process.

Since the conductive paste used in the present invention includes the conductive particles and the dopant, and the second type heavily doped diffusion region is formed during the co-firing process. The fabricating method of the invention has the benefits of reducing fabrication costs, having high yield-rate and being easy to control.

To make the above and other objectives, features, and advantages of the present invention more comprehensible, several embodiments accompanied with figures are detailed as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
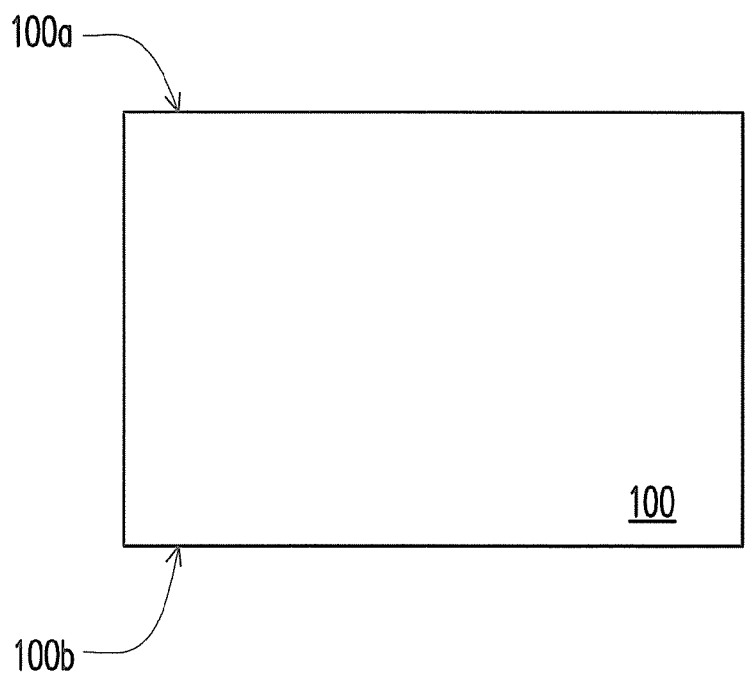
FIG. 1A through FIG. 1F are schematic cross-sectional views illustrating the method of fabricating a solar cell according to an embodiment of the present invention.
Figure 1B:
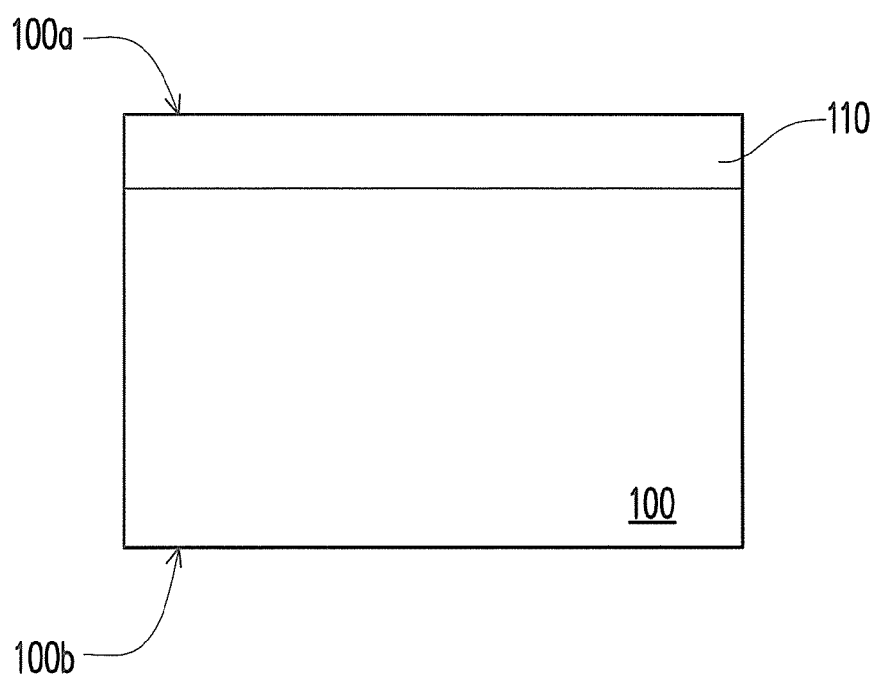

FIG. 1A through FIG. 1F are schematic cross-sectional views illustrating the method of fabricating a solar cell according to an embodiment of the present invention. Referring to FIG. 1A, a first type semiconductor substrate 100 is provided. The first type semiconductor substrate 100 is a P-type semiconductor substrate, for example. In the present embodiment, the first type semiconductor substrate 100 is a silicon wafer with P-type dopant distributed therein. In one embodiment, the silicon wafer is a boron doped silicon wafer. The first type semiconductor substrate 100 has a first surface 100a and a second surface 100b opposite to the first surface 100a. Referring to FIG. 1B, a doping process is performed on the first surface 100a of the first type semiconductor substrate 100 such that a second type doped diffusion region 110 is formed in a portion of the first type semiconductor substrate 100, wherein the second type doped diffusion region 110 extends in the first type semiconductor substrate 100 from the first surface 100a. Specifically, the thickness of the first type semiconductor substrate 100 can be in a range from about 50 micrometer to about 250 micrometer, and the depth of the second type doped diffusion region 110 can be in a range from about 0.01 micrometer to about 5.0 micrometer. In an alternate embodiment, the depth of the second type doped diffusion region 110 ranges from about 0.05 micrometer to about 2.0 micrometer. In a preferred embodiment, the depth of the second type doped diffusion region 110 can be in a range from about 0.1 micrometer to about 0.5 micrometer.

The above-mentioned doping process is utilized to form a P-N junction in the first type semiconductor substrate 100. The above-mentioned doping process can at least include the following steps. For example, a phosphosilicate glass (PSG) layer is formed over the first surface 100a of the first type semiconductor substrate 100, and the first type semiconductor substrate 100 is then moved into a diffusion oven. During a thermal treatment performed in the diffusion oven, dopant in the PSG layer diffuses into the first type semiconductor substrate 100 such that the second type doped diffusion region 110 (i.e. N-type doped diffusion region) is formed. Thereafter, the PSG layer is removed. In the present embodiment, the dopant in the PSG layer may include Phosphorus chloride oxide ($POCl_3$) or other materials suitable for forming P-N junction in the first type semiconductor substrate 100. It is noted that the above-mentioned doping process is described for illustration. In other words, the second type doped diffusion region 110 may be formed by other suitable doping processes.

In the present embodiment, the P-type semiconductor substrate (100) and the N-type doped diffusion region (110) are described for illustration, one ordinary skilled in the art may adopt an N-type semiconductor substrate and form a P-type doped diffusion region in the N-type semiconductor substrate. Moreover, one ordinary skilled in the art may also adopt an intrinsic (I-type) semiconductor substrate and form a P-type or N-type doped diffusion region in the intrinsic (I-type) semiconductor substrate.

Figure 1C:
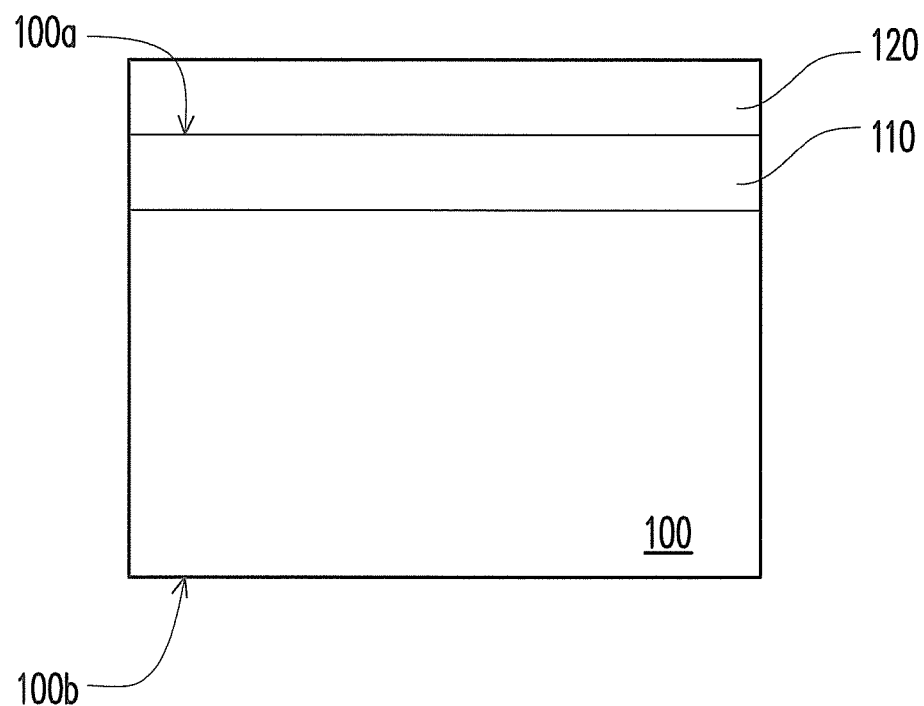

Referring FIG. 1C, after the second type doped diffusion region 110 is formed, an anti-reflection layer 120 is formed on the first surface 100a of the first type semiconductor substrate 100, wherein the anti-reflection layer 120 is in contact with the second type doped diffusion region 110. In the present embodiment, the material of the anti-reflection layer 120 can be silicon nitride or silicon oxide. The anti-reflection layer 120 is formed by a chemical vapor deposition process (e.g. a plasma enhanced chemical vapor deposition process).

Figure 1D:
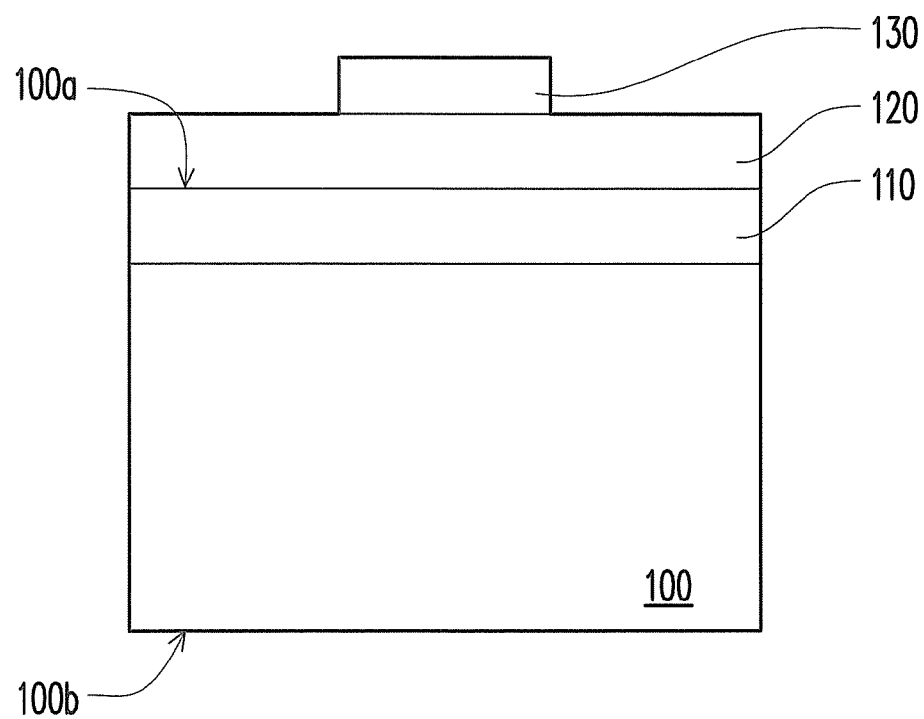

Referring to FIG. 1D, a conductive paste 130 is formed on the anti-reflection layer 120. For example, the conductive paste 130 is formed on the anti-reflection layer 120 by a screen printing process. The conductive paste 130 at least includes a plurality of conductive particles and at least one dopant. In the present embodiment, in order to uniformly mix the conductive particles and the dopant, the conductive paste 130 may further include a matrix, a binder and so on. Moreover, the conductive paste 130 may further include a solvent, an additive, a softener and so on, such that the conductive particles and the dopant in the conductive paste 130 can be mixed more uniformly. For example, the conductive particles in the conductive paste 130 can be silver (Ag) particles or aluminum (Al) particles, for example. The diameter of the conductive particles can be in a range from about 10 nanometer to about 5 micrometer. Further lore, the material of the matrix in the conductive paste 130 can be silicon oxide matrix or silicon matrix, for example. During the fabrication of the N-type doped diffusion region, the dopant in the conductive paste 130 can be $H_3PO_4$, $P_2O_5$, $POCl_3$ or other similar dopant, for example. In an alternate embodiment, during the fabrication of the P-type doped diffusion region, the dopant in the conductive paste 130 can be $B_2O_3$, aluminum salts or other similar dopant, for example. The concentration of the dopant is sufficient to form a second type heavily doped diffusion region 140.

In the present embodiment, the binder in the conductive paste 130 may be a thickening agent or a wetting agent, for example. The above-mentioned thickening agent or wetting agent may include Thixoton (ricinus oil), Borchigen TS (silicic acid additive), silsequioxanes (e.g. silsequioxanes containing inorganic fluid additive having mixed solvents with different polarities), nitrocellulose, ethylcellulose, fiber compounds, polyvinylpyrrolidones, starch(+NH4OH), gelatine, alginic acid, synthetic Mg—Na—Li silicate (Laponite), high disperse amorphous silicic acid (Aerosil), polyvinylbutyral (Mowital), sodium carboxymethylcellulose (vivistar) and so on.

In the present embodiment, the additive may be an antifoaming agent, an adhesion moderator, a leveling agent or a thixotropic agent, for example.

In the present embodiment, the material of the softener can be PbO, ZnO or $Bi_2O_3$.

In the present embodiment, the solvent, for example, can be ethylene glycol, ethylene glycol monobutyl ether, ethylene glycol monophenyl ether, methoxymethoxyethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methylethyl ether, diethylene glycol diethyl ether, diethylene glycol acetate, triethylglycol, triethylene glycol monomethyl ether, triethylene glycol monoethyl ether, etraethylene glycol, polyethylene glycols, propylene glycol, propylene glycol monomethyl ether, propylene glycol monoethyl ether, propylene glycol monobutyl ether, 1-butoxyethoxypropanol, dipropylglycol, dipropylene glycol monomethyl ether, dipropylene glycol monoethyl ether, tripropylene glycol monomethyl ether, polypropylene glycols, trimethylene glycol, butanediol, 1,5-pentanediol, hexylene glycol, glycerine, glyceryl acetate, glyceryl diacetate, glyceryl triacetate, trimethylolpropyne, 1,2,6-haxanetriol, dioxane, trioxane, tetrahydrofuran, methylal, diethylacetal, methyl ethyl ketone, methyl isobutyl ketone, diethyl ketone, acetonylacetone, diacetone alcohol, methyl formate, ethyl formate, propyl formate, methyl acetate or ethyl acetate.

Figure 1E:
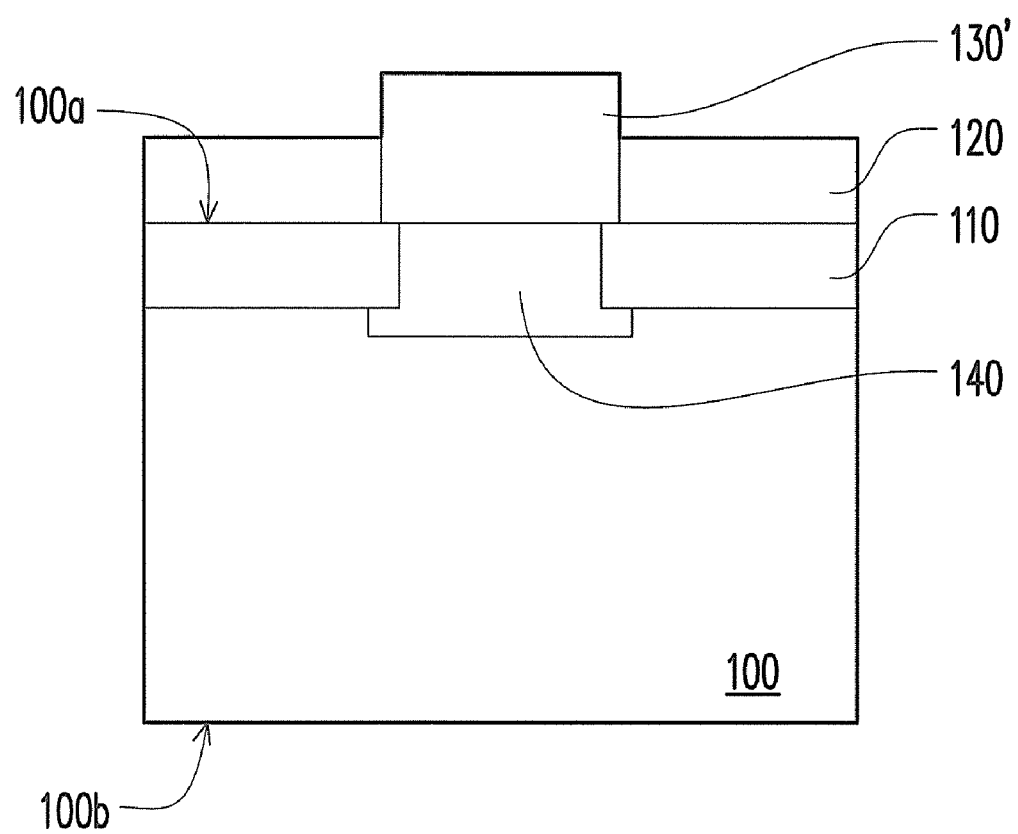

Referring to FIG. 1E, a co-firing process is performed such that the conductive paste 130 penetrates the anti-reflection layer 120 to form a first contact conductor 130' embedded in the anti-reflection layer 120. During the co-firing process, the dopant in the conductive paste 130 (shown in FIG. 1D) diffuses into the second type doped diffusion region 110 of the first type semiconductor substrate 100 and the second type heavily doped diffusion region 140 is formed correspondingly. Specifically, a portion of the first type semiconductor substrate 100 is melted by the co-firing process. The melted portion of the first type semiconductor substrate 100 and the conductive paste 130 (shown in FIG. 1D) thereafter form an eutectic part such that the dopant and the conductive particles in the conductive paste 130 (shown in FIG. 1D) diffuse into the first type semiconductor substrate 100. It is note that the softener (e.g. PbO, ZnO or $Bi_2O_3$) in the conductive paste 130 (shown in FIG. 1D) can lower the eutectic temperature of the eutectic part. Accordingly, the diffusion of the dopant and the conductive particles can be enhanced by the softener also. Moreover, after the co-firing process is performed, there may be small amount of the matrix, additive, thickening agent and wetting agent existing in the conductive paste 130 (shown in FIG. 1D). The solvent almost is evaporated.

Figure 1F:
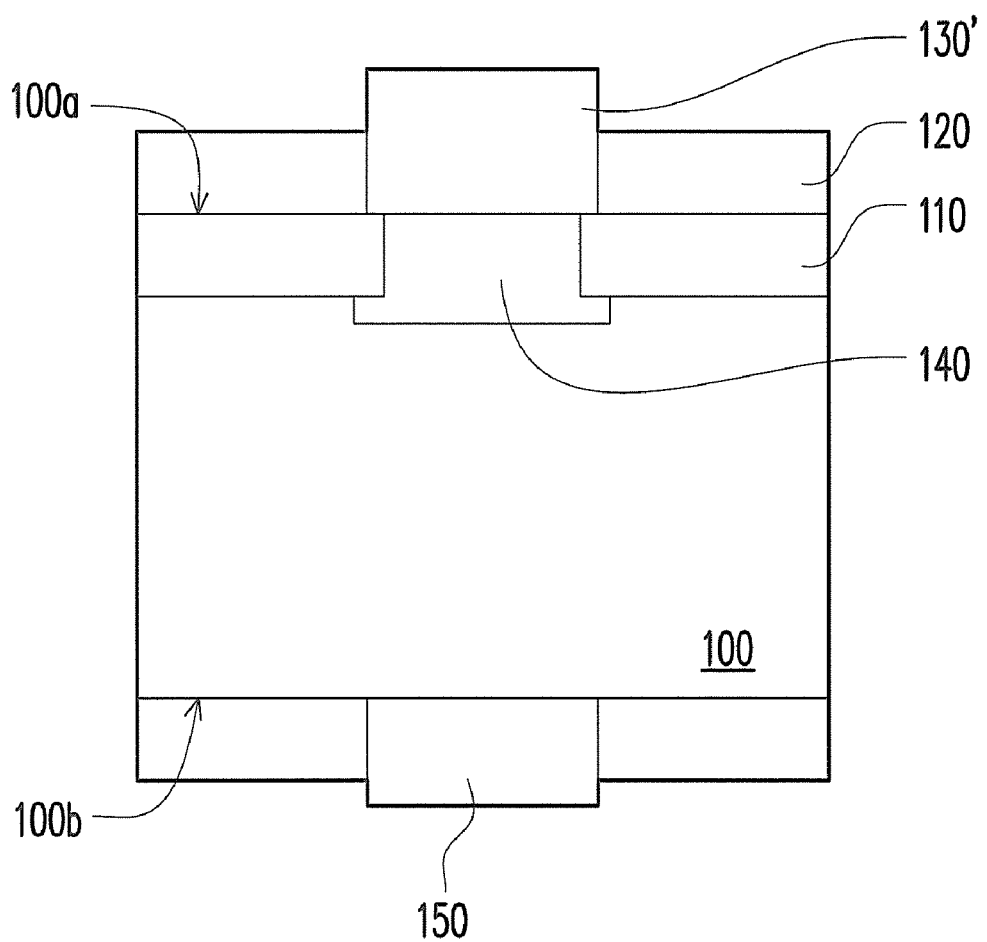

Referring FIG. 1F, after the second type heavily doped diffusion region 140 is formed, a second contact conductor 150 is optionally formed on the second surface 100b of the first type semiconductor substrate 100. After second contact conductor 150 is formed, fabrication of the solar cell of the present embodiment is substantially completed. In an alternate embodiment, the second contact conductor 150 may be formed on the first surface 110a of the first type semiconductor substrate 100 to obtain a solar cell having a back contact structure.

In the present embodiment, the depth of the second type heavily doped diffusion region 140 is greater than the depth of the second type doped diffusion region 110, for example. In the present embodiment, the depth of the second type heavily doped diffusion region 140 can be in a range from about 0.01 micrometer to about 10.0 micrometer. In an alternate embodiment, the depth of the second type heavily doped diffusion region 140 can be in a range from about 0.05 micrometer to about 3.0 micrometer. In a preferred embodiment, the depth of the second type heavily doped diffusion region 140 can be in a range from about 0.1 micrometer to about 1.0 micrometer. It is noted that the depth of the second type heavily doped diffusion region 140 may be smaller than or substantially equal to the depth of the second type doped diffusion region 110. The relationship between the depth of the second type heavily doped diffusion region 140 and the depth of the second type doped diffusion region 110 is not limited in the present application.

The above-mentioned fabricating method of solar cells can be applied to fabricate single facial solar cells or bifacial solar cells.

Since the conductive paste used in the present invention includes conductive particles and dopant, and the second type heavily doped diffusion region is formed by co-firing process, the fabricating method of the invention has the advantages of reducing fabrication costs, having high yield-rate and being easy to control.

Although the present invention has been disclosed by the above embodiments, they are not intended to limit the present invention. Those skilled in the art may make some modifications and alterations without departing from the spirit and scope of the present invention. Therefore, the protection range of the present invention falls in the appended claims.

What is claimed is:

1. A fabricating method of a solar cell, comprising:
providing a semiconductor substrate, the semiconductor substrate having a first surface and a second surface opposite to the first surface;
forming an anti-reflection layer on the first surface of the semiconductor substrate;
forming a conductive paste on the anti-reflection layer, the conductive paste including a plurality of conductive particles, a plurality of dopants and a matrix; and
performing a co-firing process to diffuse the conductive particles of the conductive paste into the anti-reflection layer to form a first contact conductor embedded in the anti-reflection layer contacted to the conductive paste, and to diffuse the dopants into the semiconductor substrate to form a doped diffusion region embedded into the semiconductor substrate and contacted to the first contact conductor during the co-firing process.

2. A fabricating method of a solar cell, comprising:
providing a first type semiconductor substrate, the first type semiconductor substrate having a first surface and a second surface opposite to the first surface;
forming an anti-reflection layer on the first surface of the first type semiconductor substrate;
forming a conductive paste on the anti-reflection layer, the conductive paste including a plurality of conductive particles and a plurality of second type dopants and a matrix; and
performing a co-firing process to diffuse the conductive particles of the conductive paste into the anti-reflection layer to form a first contact conductor embedded in the anti-reflection layer contacted to the conductive paste, and to diffuse the second type dopants into the first type semiconductor substrate to form a second type heavily doped diffusion region embedded in the first type semiconductor substrate and contacted to the first contact conductor during the co-firing process.

3. The method of claim 2, further comprises forming a second type doped diffusion region in a portion of the first type semiconductor substrate, the second type doped diffusion region extending in the first type semiconductor substrate from the first surface before forming the anti-reflection layer, wherein the first type semiconductor substrate is a P-type semiconductor substrate, and the second type doped diffusion region is an N-type doped diffusion region.

4. The method of claim 3, wherein a thickness of the first type semiconductor substrate is greater than a depth of the second type doped diffusion region.

5. The method of claim 2, wherein the conductive particles includes silver (Ag) particles.

6. The method of claim 2, wherein the conductive particles includes aluminum (Al) particles.

7. The method of claim 2, wherein the dopant includes $B_2O_3$, $H_3PO_4$, $P_2O_5$ or aluminum salts.

8. The method of claim 2, wherein the conductive paste is formed on the anti-reflection layer by a screen printing process.

9. The method of claim 2, wherein the anti-reflection layer is formed on the first surface of the first type semiconductor substrate by a chemical vapor deposition process.

10. The method of claim 2, further comprises forming a second contact conductor on the second surface of the first type semiconductor substrate.

11. A fabricating method of a solar cell, comprising:
providing a first type semiconductor substrate, the first type semiconductor substrate having a first surface and a second surface opposite to the first surface;
forming an anti-reflection layer on the first surface of the first type semiconductor substrate;
forming a conductive paste on the anti-reflection layer, the conductive paste including a plurality of conductive particles, a plurality of second type dopants, a matrix and a binder;
performing a co-firing process to diffuse the conductive particles of the conductive paste into the anti-reflection layer to form a first contact conductor embedded in the anti-reflection layer contacted to the conductive paste, and to diffuse the second type dopants into the first type semiconductor substrate to form a second type heavily doped diffusion region embedded in the first type semiconductor substrate and contacted to the first contact conductor during the co-firing process; and
forming a second contact conductor on the second surface of the first type semiconductor substrate.

12. The method of claim 11, further comprises forming a second type doped diffusion region in a portion of the first type semiconductor substrate, the second type doped diffusion region extending in the first type semiconductor substrate from the first surface before forming the anti-reflection layer, wherein the first type semiconductor substrate is a P-type semiconductor substrate, and the second type doped diffusion region is an N-type doped diffusion region.

13. The method of claim 12, wherein a thickness of the first type semiconductor substrate is greater than a depth of the second type doped diffusion region.

14. The method of claim 11, wherein the conductive particles includes silver (Ag) particles.

15. The method of claim 11, wherein the conductive particles includes aluminum (Al) particles.

16. The method of claim 11, wherein the dopant includes $B_2O_3$, $H_3PO_4$, $P_2O_5$ or aluminum salts.

17. The method of claim 11, wherein the matrix includes a silicon oxide matrix or a silicon matrix.

18. The method of claim 11, wherein the binder includes a thickening agent or a wetting agent.

19. The method of claim 11, wherein the conductive paste further comprises an additive.

20. The method of claim 11, wherein the conductive paste further comprises a solvent.

21. The method of claim 11, wherein the conductive paste is formed on the anti-reflection layer by a screen printing process.

22. The method of claim 11, wherein the anti-reflection layer is formed on the first surface of the first type semiconductor substrate by a chemical vapor deposition process.

* * * * *